(12) United States Patent
Trampitsch

(10) Patent No.: US 12,040,787 B2
(45) Date of Patent: Jul. 16, 2024

(54) ISOLATED BOOTSTRAPPED SWITCH CIRCUIT

(71) Applicant: Analog Devices International Unlimited Company, Limerick (IE)

(72) Inventor: Gerd Trampitsch, Munich (DE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/960,594

(22) Filed: Oct. 5, 2022

(65) Prior Publication Data
US 2024/0120917 A1 Apr. 11, 2024

(51) Int. Cl.
*H03K 17/687* (2006.01)
(52) U.S. Cl.
CPC ................. *H03K 17/6871* (2013.01)
(58) Field of Classification Search
CPC .................................. H03K 17/6871
See application file for complete search history.

(56) References Cited

U.S. PATENT DOCUMENTS

| 8,890,577 B1 | 11/2014 | Trampitsch |
| 8,907,703 B1 | 12/2014 | Trampitsch |
| 9,172,364 B2 | 10/2015 | Trampitsch |
| 2015/0109161 A1* | 4/2015 | Trampitsch .......... H03K 17/063 341/172 |

* cited by examiner

*Primary Examiner* — Metasebia T Retebo
(74) *Attorney, Agent, or Firm* — North Weber & Baugh LLP; Michael North

(57) ABSTRACT

A bootstrapped switch circuit coupled to a timing circuit. The bootstrapped switch circuit comprises a charge pump coupled to the timing circuit. The bootstrapped switch circuit also comprises a logic circuit coupled to the output of the charge pump and the timing circuit. The logic circuit is capable of generating multiple control signals which can independently control the turn-on of switches in the voltage path between the inputs and outputs of the bootstrapped switch circuit.

20 Claims, 9 Drawing Sheets

ISOLATED BOOTSTRAPPED SWITCH CIRCUIT

FIELD

This application relates to sampling switches and, in particular but not exclusively, to the configuration and control of switch circuits that can be used in a variety of analog circuits, such as input stages of analog-to-digital converters (ADCs). More specifically, this disclosure provides pertains to improved control of switch circuits to enhance switch performance metrics.

BACKGROUND

Switches can be used to provide or restrict an electrical path between terminals. Switches can be implemented using transistors in a variety of applications including digital electronics, logic gate circuits, and control of high-power devices such as motors. As an example, a single transistor can be used to generate a low impedance or a high impedance between the source and the drain of the transistor in response to an applied control signal.

SUMMARY OF THE DISCLOSURE

The present disclosure related to a bootstrapped switch circuit coupled to a timing circuit. The bootstrapped switch circuit comprises a charge pump coupled to the timing circuit. The bootstrapped switch circuit also comprises a logic circuit coupled to the output of the charge pump and the timing circuit. The logic circuit is capable of generating multiple control signals which can independently control the turn-on of switches in the voltage path between the inputs and outputs of the bootstrapped switch circuit.

In some aspects, this disclosure is directed to a bootstrapped switch circuit coupled to a timing circuit that provides one or more signals, the bootstrapped switch circuit having one or more input terminals and one or more output terminals, the bootstrapped switch circuit being electrically isolated from a power supply of the timing circuit, the bootstrapped switch circuit comprising: a charge pump including an input coupled to the one or more input terminals of the bootstrapped switch circuit and the timing circuit, wherein the charge pump generates a charge pump voltage at an output of the charge pump; a logic circuit coupled to the timing circuit, the logic circuit including a voltage input coupled to the output of the charge pump, wherein the logic circuit generates: a first control signal based on the voltage input at a first output terminal; and a second control signal based on the voltage input at a second output terminal; a first switch having a first terminal coupled to the one or more input terminals of the bootstrapped switch circuit, a second terminal coupled to the one or more output terminals, and a control terminal coupled to the first output terminal of the logic circuit; and a second switch having a first terminal coupled to the one or more input terminals of the bootstrapped switch circuit, a second terminal coupled to the one or more output terminals, and a control terminal coupled to the second output terminal of the logic circuit.

Optionally, both the first control signal and the second control signal are derived from a signal level shifted to the charge pump voltage domain.

Optionally wherein the first control signal is in the charge pump voltage domain. Optionally wherein the second control signal is in the charge pump voltage domain.

The bootstrapped switch circuit is an area efficient way of implementing isolated bootstrapped switches because of the reduced number of charge pumps needed for driving multiple switches. About two times reduced area may be achieved with the aspects of the present disclosure.

Optionally, the logic circuit comprises a latch circuit and a non-overlapping clock generation circuit, wherein the latch circuit is coupled to the timing circuit and generates a logic signal, wherein the non-overlapping clock generation circuit generates the first control signal and the second control signal based on the logic signal.

Optionally, the logic signal generated by the latch circuit is in a charge pump voltage domain. Optionally, the first control signal and the second control signal are in the charge pump voltage domain.

Optionally, the charge pump is coupled to the timing circuit via a level shifter circuit, which may be one or more capacitors. Optionally, the logic circuit is coupled to the timing circuit via a level shifter circuit, which may be one or more capacitors.

Optionally, the non-overlapping clock generation circuit comprises: a first input terminal coupled to the one or more input terminals of the bootstrapped switch circuit; a second input terminal configured to receive the logic signal; a third input terminal coupled to the output of the charge pump and configured to receive the charge pump voltage, wherein the non-overlapping clock generation circuit generates the first control signal at the first output terminal of the logic circuit and the second control signal at the second output terminal of the logic circuit.

Optionally, the first control signal has a different timing to the second control signal.

Optionally, the first control signal may have an inverse timing to the second control signal.

Optionally, the one or more output terminals comprise: a first output terminal coupled to the second terminal of the first switch; and a second output terminal coupled to the second terminal of the second switch, wherein the first terminal of the first switch is coupled to the first terminal of the second switch.

Optionally, the bootstrapped switch circuit further comprises: a signal adjustment circuit, wherein the signal adjustment circuit is a level shifter circuit or a gain stage, wherein the one or more input terminals of the bootstrapped switch circuit comprise: a first input terminal coupled to the charge pump and the first terminal of the first switch; and a second input terminal coupled to the first terminal of the second switch, wherein the second output terminal of the logic circuit is coupled to the control terminal of the second switch via the signal adjustment circuit.

Optionally, the second input terminal is coupled to the charge pump. Optionally, the first output terminal of the logic circuit is coupled to the control terminal of the first switch via a second signal adjustment circuit, wherein the second signal adjustment circuit is a level shifter circuit or a gain stage.

Optionally, the first input terminal is a positive input terminal directly coupled to the charge pump, and the second input terminal is a negative input terminal.

Optionally, the signal adjustment circuit is a level shifter circuit comprising capacitors.

Optionally, the signal adjustment circuit is a gain stage.

Optionally, the bootstrapped switch circuit further comprises: a first gain stage and a second gain stage, wherein the one or more input terminals of the bootstrapped switch circuit comprise: a first input terminal coupled the first terminal of the first switch; and a second input terminal coupled to the first terminal of the second switch, wherein the input of the charge pump is configured to receive a common mode voltage generated using a voltage at the first input terminal and a voltage at the second input terminal, wherein the first output terminal of the logic circuit is coupled to the control terminal of the first switch via the first gain stage, wherein the second output terminal of the logic circuit is coupled to the control terminal of the second switch via the second gain stage.

Optionally wherein the first input terminal is at a greater voltage potential than the second input terminal.

Optionally, the bootstrapped switch circuit further comprises: a first resistor coupled between the first input terminal and the input of the charge pump; a first capacitor coupled in parallel with the first resistor; a second resistor coupled between the second input terminal and the input of the charge pump; and, a second capacitor coupled in parallel with the second resistor.

Optionally, the logic circuit further generates: a third control signal based on the voltage input at a third output terminal of the logic circuit; and a fourth control signal based on the voltage input at a fourth output terminal of the logic circuit, wherein the bootstrapped switch circuit further comprises: a first signal adjustment circuit, wherein the signal adjustment circuit is a level shifter circuit or a gain stage; a second signal adjustment circuit, wherein the signal adjustment circuit is a level shifter circuit or a gain stage; a third switch having a first terminal coupled to the one or more input terminals of the bootstrapped switch circuit, a second terminal coupled to the one or more output terminals, and a control terminal, wherein the third output terminal of the logic circuit is coupled to the control terminal of the third switch via the first signal adjustment circuit; and a fourth switch having a first terminal coupled to the one or more input terminals of the bootstrapped switch circuit, a second terminal coupled to the one or more output terminals, and a control terminal, wherein the fourth output terminal of the logic circuit is coupled to the control terminal of the fourth switch via the second signal adjustment circuit, wherein the one or more input terminals of the bootstrapped switch circuit comprise: a first input terminal coupled to the first terminal of the first switch and the first terminal of the second switch; and a second input terminal coupled to the first terminal of the third switch and the first terminal of the fourth switch.

Optionally, the second terminal of the first switch is coupled to the second terminal of the fourth switch, and the second terminal of the second switch is coupled to the second terminal of the third switch.

Optionally, the one or more output terminals are arranged to be coupled to an analog-to-digital converter circuit.

Optionally the one or more output terminals of the bootstrapped switch circuit comprise an output coupled to the second terminal of the first switch and the second terminal of the second switch. Optionally, the output is arranged to be coupled to an input of an analog-to-digital converter circuit.

Optionally the bootstrapped switch circuit further comprising a common mode voltage generation circuit comprising: a first resistor coupled between the first input terminal and the input of the charge pump; a first capacitor coupled in parallel with the first resistor; a second resistor coupled between the second input terminal and the input of the charge pump; and, a second capacitor coupled in parallel with the second resistor.

In some aspects, this disclosure is directed to a circuit comprising: a bootstrapped switch circuit coupled to a timing circuit that provides one or more signals, the bootstrapped switch circuit having one or more input terminals and one or more output terminals, the bootstrapped switch circuit being electrically isolated from a power supply of the timing circuit, the bootstrapped switch circuit including: a charge pump comprising an input coupled to the one or more input terminals of the bootstrapped switch circuit and the timing circuit, wherein the charge pump generates a charge pump voltage at an output of the charge pump; a logic circuit coupled to the timing circuit, the logic circuit including a voltage input coupled to the output of the charge pump, wherein the logic circuit receives a timing control signal and generates: a first control signal based on the timing control signal at a first output terminal; and a second control signal based on the timing control signal at a second output terminal, wherein the first control signal has a different timing to the second control signal; a first switch having a first terminal coupled to the one or more input terminals of the bootstrapped switch circuit, a second terminal coupled to the one or more output terminals, and a control terminal coupled to the first output terminal of the logic circuit; a second switch having a first terminal coupled to the one or more input terminals of the bootstrapped switch circuit, a second terminal coupled to the one or more output terminals, and a control terminal coupled to the second output terminal of the logic circuit; a first capacitor comprising: a first terminal coupled to the one or more output terminals of the bootstrapped switch circuit; and a second terminal; and an analog-to-digital converter circuit comprising: a first input terminal coupled to the second terminal of the first capacitor.

Optionally wherein a first control signal is based on the timing control signal and the voltage input at a first output terminal, such that the first control signal may be in the charge pump voltage domain. Optionally, wherein a second control signal is based on the timing control signal and the voltage input at a second output terminal, such that the second control signal may be in the charge pump voltage domain.

Optionally, the one or more output terminals of the bootstrapped switch circuit comprise a first output terminal and a second output terminal of the bootstrapped switch circuit, wherein the circuit further comprises: a second capacitor comprising: a first terminal coupled to the second output terminal of the bootstrapped switch circuit; and a second terminal; and, wherein the first terminal of the first capacitor is coupled to the first output terminal of the bootstrapped switch circuit, wherein the analog-to-digital converter circuit further comprises a second input terminal coupled to the second terminal of the second capacitor.

Optionally, the analog-to-digital converter circuit is configured in a fully differential configuration.

Optionally, the circuit is a battery management circuit, wherein the logic circuit further generates: a third control signal based on the voltage input at a third output terminal of the logic circuit; and a fourth control signal based on the voltage input at a fourth output terminal of the logic circuit, wherein the bootstrapped switch circuit further comprises: a first signal adjustment circuit, wherein the signal adjustment circuit is a level shifter circuit or a gain stage; a second signal adjustment circuit, wherein the signal adjustment circuit is a level shifter circuit or a gain stage; a third switch having a first terminal coupled to the one or more input terminals of the bootstrapped switch circuit, a second terminal coupled to the one or more output terminals, and a control terminal coupled to the third output terminal of the logic circuit via the first signal adjustment circuit; and a fourth switch having a first terminal coupled to the one or more input terminals of the bootstrapped switch circuit, a second terminal coupled to the one or more output terminals, and a control terminal coupled to the fourth output terminal of the logic circuit via the second signal adjustment circuit, wherein the one or more input terminals of the bootstrapped switch circuit comprise: a first input terminal and a second input terminal, wherein the first terminal of the first switch is coupled to the first terminal of the second switch and the first input terminal of the bootstrapped switch circuit, and wherein the first terminal of the third switch is coupled to the first terminal of the fourth switch and the second input terminal of the bootstrapped switch circuit, wherein the first input terminal of the bootstrapped switch circuit is arranged to be coupled to a battery cell anode, and the second input terminal of the bootstrapped switch circuit is arranged to be coupled to a battery cell cathode.

Optionally, the second terminal of the first switch is coupled to the second terminal of the fourth switch and the first terminal of the first capacitor, a second capacitor comprising: a first terminal coupled to the second output terminal of the bootstrapped switch circuit; and a second terminal; and, wherein the first terminal of the first capacitor is coupled to the first output terminal of the bootstrapped switch circuit, the analog-to-digital converter circuit has a second input terminal coupled to the second terminal of the second capacitor, and the second terminal of the second switch is coupled to the second terminal of the third switch and the first terminal of the second capacitor.

In some aspects, this disclosure is directed to a circuit comprising: a bootstrapped switch circuit coupled to a timing circuit that provides one or more signals, the bootstrapped switch circuit being electrically isolated from a power supply of the timing circuit, the bootstrapped switch circuit comprising: a first input terminal and a second input terminal; one or more output terminals; a charge pump coupled to the timing circuit, wherein the charge pump comprises an input configured to receive a common mode voltage generated based on: the input voltage at the first input terminal of the bootstrapped switch circuit; and the second input voltage at the second input terminal of the bootstrapped switch circuit, wherein the charge pump generates a charge pump voltage at an output of the charge pump; a logic circuit coupled to the timing circuit, the logic circuit comprising a voltage input coupled to the output of the charge pump, wherein the logic circuit generates: a first control signal; and a second control signal; a first signal adjustment circuit, wherein the signal adjustment circuit is a level shifter circuit or a gain stage, and configured to receive the first control signal and generate a first adjusted control signal; a second signal adjustment circuit, wherein the signal adjustment circuit is a level shifter circuit or a gain stage configured to receive the second control signal and generate a second adjusted control signal; a first switch having a first terminal coupled to the first input terminal of the bootstrapped switch circuit, a second terminal coupled to the one or more output terminals, and a control terminal configured to receive the first adjusted control signal; and a second switch having a first terminal coupled to the second input terminal of the bootstrapped switch circuit, a second terminal coupled to the one or more output terminals, and a control terminal configured to receive the second adjusted control signal.

Optionally wherein the first input terminal is at a greater voltage potential than the second input terminal.

FIGURES

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
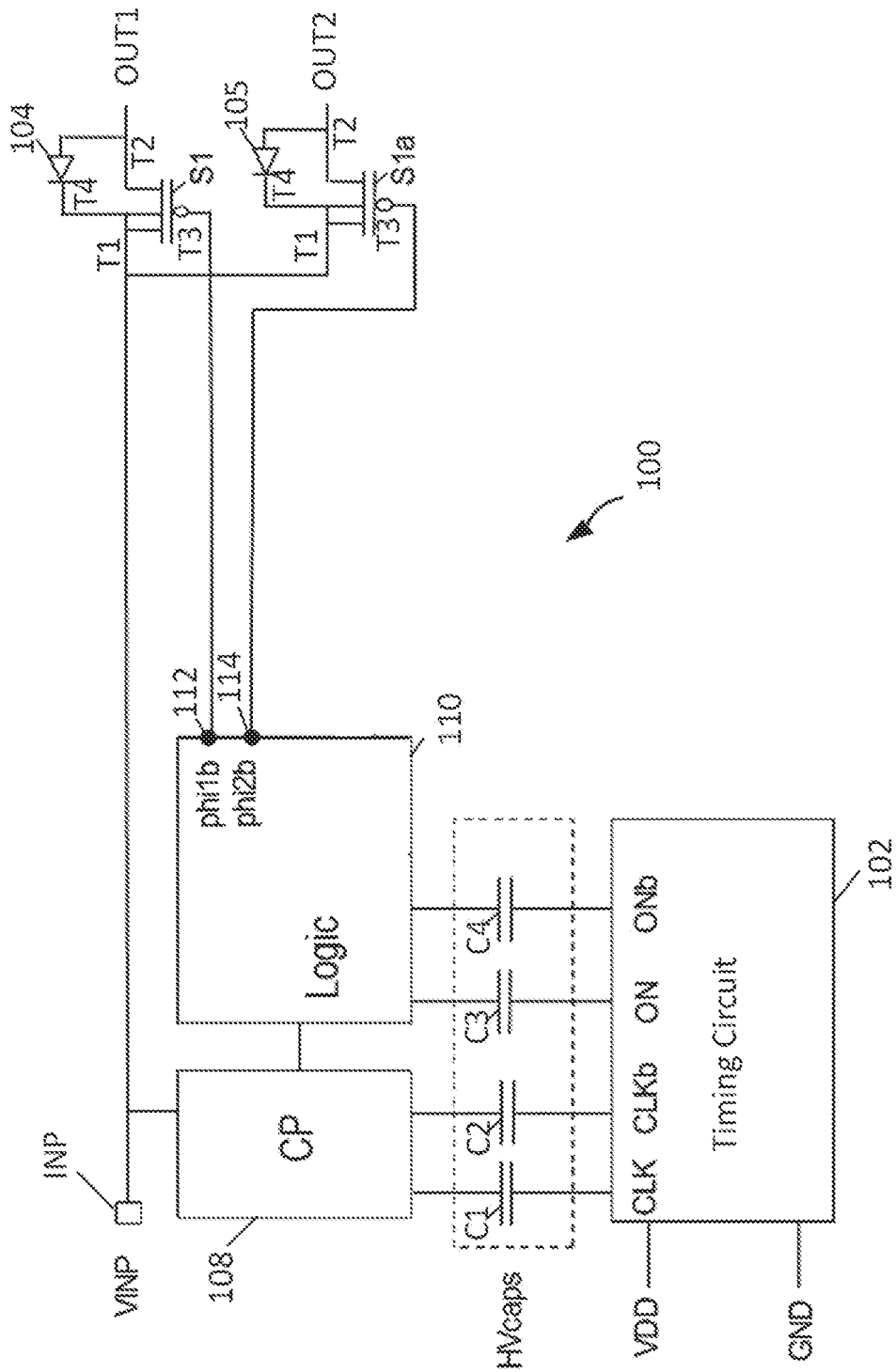
FIG. 1 is a block diagram of an example of a bootstrapped switch circuit that can implement various techniques of this disclosure coupled to a timing circuit.

In some approaches, bootstrapped switch circuits use capacitor charge pumps and digital level shifters for controlling the state of the switch (specifically controlling sampling switches). A charge pump is connected to the source of the switch and CMOS logic biased from the charge pump generates switch control signals between source and gate. Each switch, charge pump, and logic circuit may typically have four or more capacitors.

The present inventors have recognized that a problem with such configuration is that each switch needs a dedicated charge pump and logic circuit. Therefore, in systems with a N number of switches, N number of charge pumps and CMOS logic is required. This equates to a large number of charge pumps and high voltage capacitors which consume power and require a large area to implement. A large part of the power consumption in a bootstrapped switch circuit comes from driving parasitic capacitors from the bottom plate of the charge pump capacitors to ground (or a reference voltage). In addition, systems with N number of switches (with corresponding and dedicated charge pumps and CMOS logic) may have different propagation delays, therefore requiring additional circuitry to compensate. This is a particular problem for switches which are used as sampling switches for a differential analog signal—such switches typically have their outputs coupled together.

The charge pump capacitors are usually significantly larger than the level shift capacitors. The size of the charge pump capacitors determines the driving strength of the charge pump. Therefore, known bootstrapped switch circuits may have large circuit areas and be susceptible to high power consumption in the circuit.

The isolated bootstrapped switches of this disclosure can be used in, for example, input stages of switched capacitor analog-to-digital converters (ADCs), continuous time ADCs, chopped low offset amplifiers, etc. The ability to sample input signals at several megahertz even in the presence of fast common mode variations makes such switches particularly suited for use with ADC input stages of battery management ICs.

By way of a non-limiting summary of the present application, there is provided a bootstrapped switch circuit coupled to a timing circuit. The bootstrapped switch circuit comprises a charge pump coupled to the timing circuit. The bootstrapped switch circuit also comprises a logic circuit coupled to the output of the charge pump and the timing circuit. The logic circuit is capable of generating multiple control signals which can independently control the turn-on of switches in the voltage path between the input and output of the bootstrapped switch circuit. The charge pump and logic circuit may be referenced to an input voltage of the bootstrapped switch circuit. If necessary, a level shifter circuit or a gain stage may be applied to a control signal before it is applied to a control terminal of a switch. This enables the switches to be, for example, 5V CMOS transistors even when their applied source voltage is, e.g., 50V, because the relative gate-source voltage of the 5V COMS transistor may always be within ±5V.

FIG. 1 is a block diagram of an example of a bootstrapped switch circuit 100 that can implement various techniques of this disclosure coupled to a timing circuit 102. The bootstrapped switch circuit 100 may be capable of bipolar operation. The bootstrapped switch circuit 100 has an input terminal INP and two output terminals OUT1, OUT2 and is coupled to a timing circuit 102 that provides one or more signals, such as the signals CLK and CLKb, and their complements ON and ONb. The timing circuit 102 is configured to receive a supply voltage VDD and may be referenced to ground.

The bootstrapped switch circuit 100 includes a first switch S1, e.g., a P-type field-effect transistor (FET), having a first terminal T1, e.g., a source terminal, coupled to the input terminal INP, a second terminal T2, e.g., a drain terminal, coupled to the first output terminal OUT1, and a control terminal T3, e.g., a gate terminal. The switch S1 includes a body diode 104 coupled between a fourth terminal T4, e.g., the body of the switch S1 and the second terminal T2 of the switch S1.

The bootstrapped switch circuit 100 includes a second switch S1a, e.g., a P-type field-effect transistor (FET), having a first terminal T1, e.g., a source terminal, coupled to the input terminal INP, a second terminal T2, e.g., a drain terminal, coupled to the second output terminal OUT2, and a control terminal T3, e.g., a gate terminal. The second switch S1a includes a body diode 105 coupled between a fourth terminal T4, e.g., the body, of the second switch S1a and the second terminal T2 of the second switch S1a. The first terminal T1 of the first switch S1 is coupled to the first terminal T1 of the second switch S1a.

The bootstrapped switch circuit 100 includes a charge pump 108 coupled to the timing circuit 102, such as using capacitors C1 and C2, and configured to receive the signals CLK and CLKb. The charge pump 108 generates a charge pump voltage Vcp at the output of the charge pump 108 that may be below the voltage VINP at the input terminal INP. If the first and second switches S1, S1a are P-type, then in order to turn on the first or second switch S1, S1a, a voltage at its control terminal T3 must be less than the voltage VINP at the input terminal INP.

The charge pump 108 and the logic circuit 110 are controlled by the timing circuit 102. The timing circuit 102 applies the signals CLK and CLKb to the charge pump 108 and applies complementary signals ON and ONb to the logic circuit 110 to control the switches S1 and S1a.

The bootstrapped switch circuit 100 includes a logic circuit 110 coupled to the timing circuit 102, such as using capacitors C3 and C4, and is configured to receive the signals ON and ONb. The logic circuit comprises a voltage input, coupled to the output of the charge pump 108, to receive the charge pump voltage Vcp.

Figure 7:
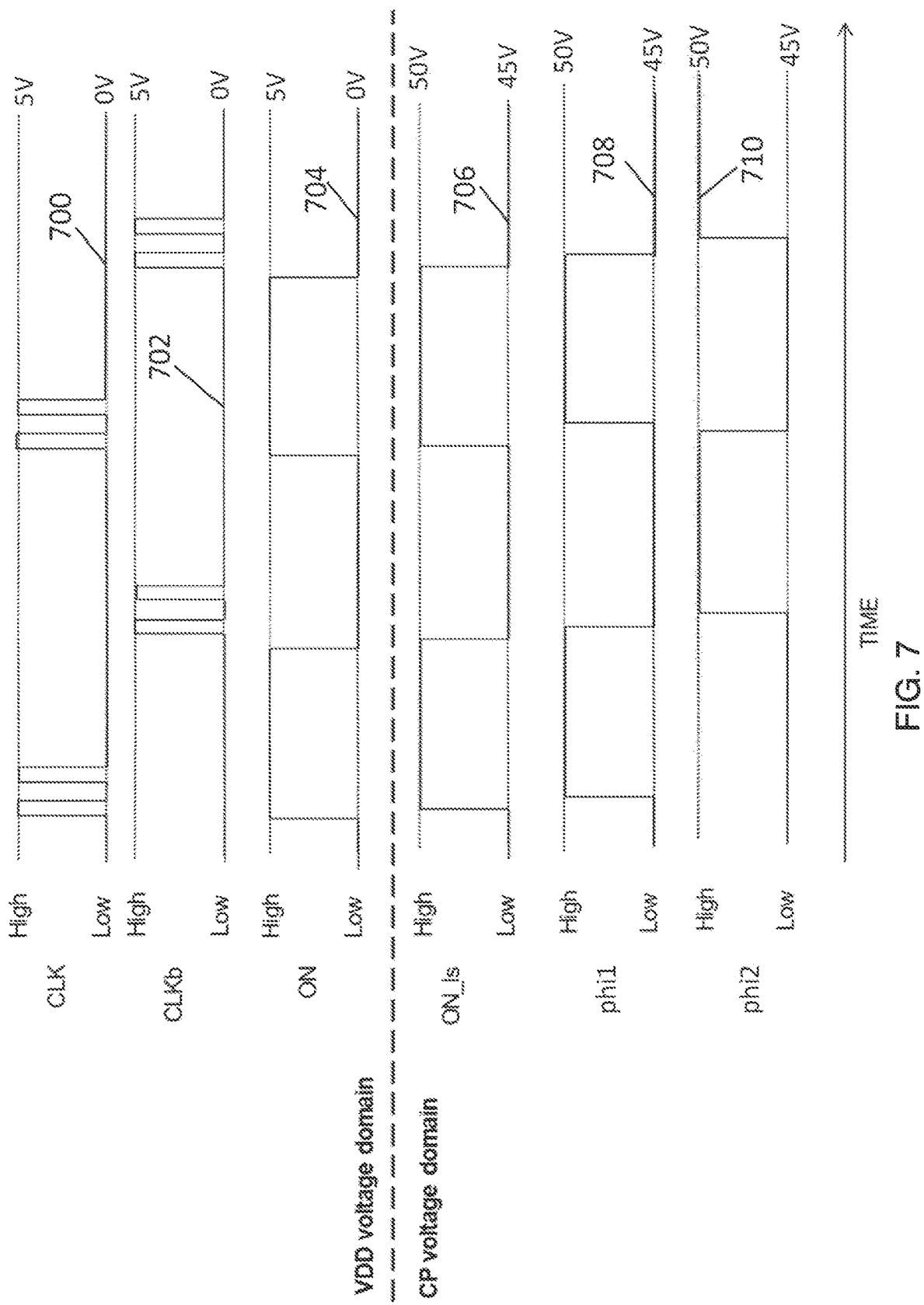
FIG. 7 is an example of a timing diagram of various signals generated by a timing circuit.

At a first output terminal 112 the logic circuit 110 generates a first control signal phi1b based on the charge pump voltage Vcp and signal ON and/or ONb. At a second output terminal 114 the logic circuit generates a second control signal phi2b based on the charge pump voltage Vcp and signal ON and/or ONb. The voltage (VINP) at the input terminal of the charge pump 108 may be a high voltage level (e.g., >5V, 10V, 50V, etc.). The charge pump voltage (Vcp) may be a low voltage level (e.g., −5V less than VINP). The control signals (phi1b, phi2b) output from the logic circuit 110 may be independent binary signals (i.e., logic level signals, e.g., −0V to −5V). The control signals (phi1b, phi2b) may control the switches (S1, S1a) by providing a voltage at either the high voltage level or the low voltage level (as shown at FIG. 7). One signal (e.g., ON, ONb) is transferred to the charge pump voltage domain and then several control signals (e.g., phi1b, phi2b, phi1, pih2) are generated by the logic circuit in the charge pump voltage domain.

The logic circuit 110 is configured to provide the first control signal phi1b to the control terminal T3 of the first switch S1. The logic circuit 110 is configured to provide the second control signal phi2b to the control terminal T3 of the second switch S1a.

Figure 3:
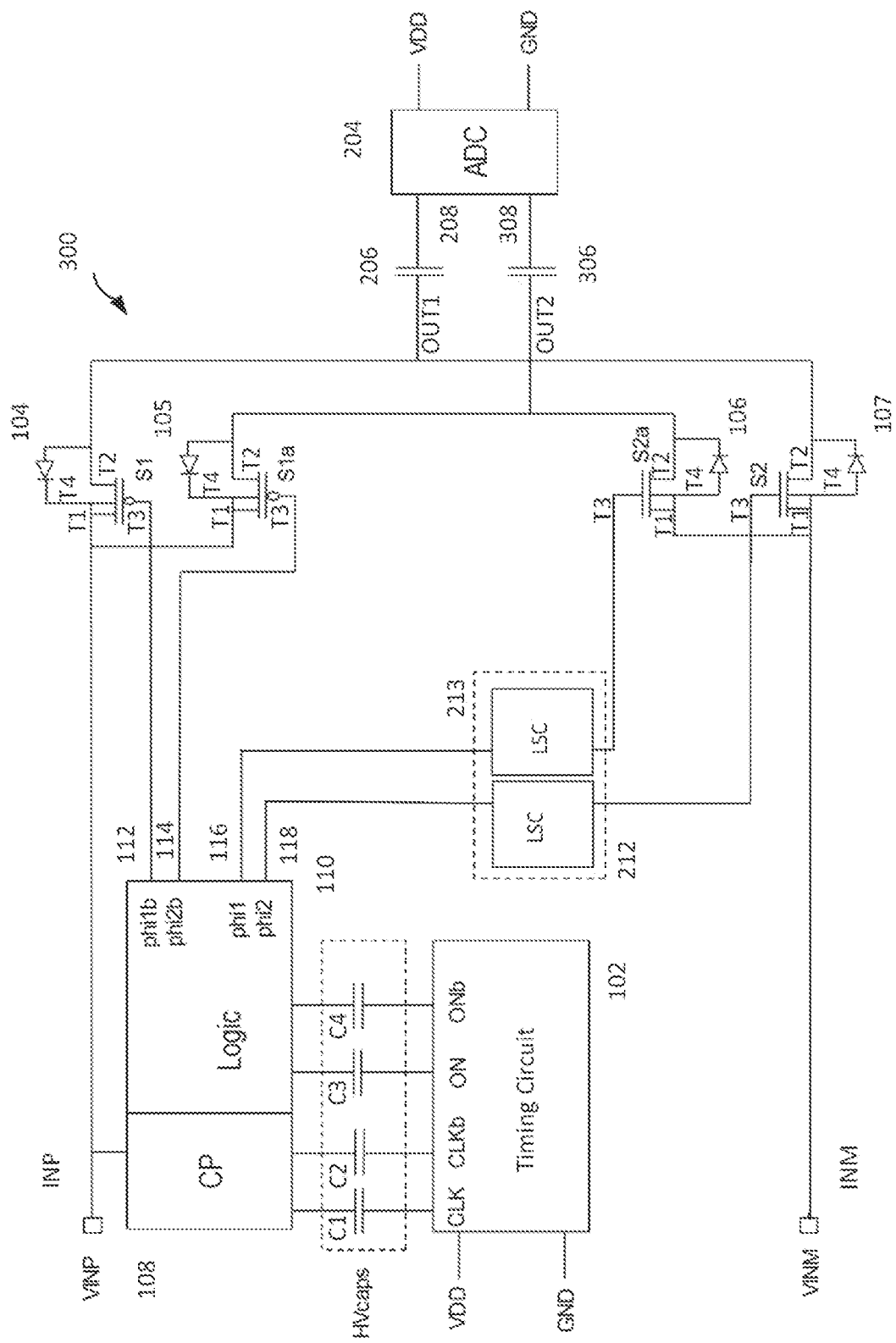
FIG. 3 is a block diagram of an example of a fully differential implementation of an ADC input stage using the bootstrapped switch circuit techniques of this disclosure.

The bootstrapped switch circuit 100 of FIG. 1 can be used as an input stage of: switched capacitor ADCs, continuous time ADCs, chopped low offset amplifiers, etc. For example, the output terminals OUT1 and OUT2 can be coupled to an ADC, such as shown in FIG. 3.

Figure 2:
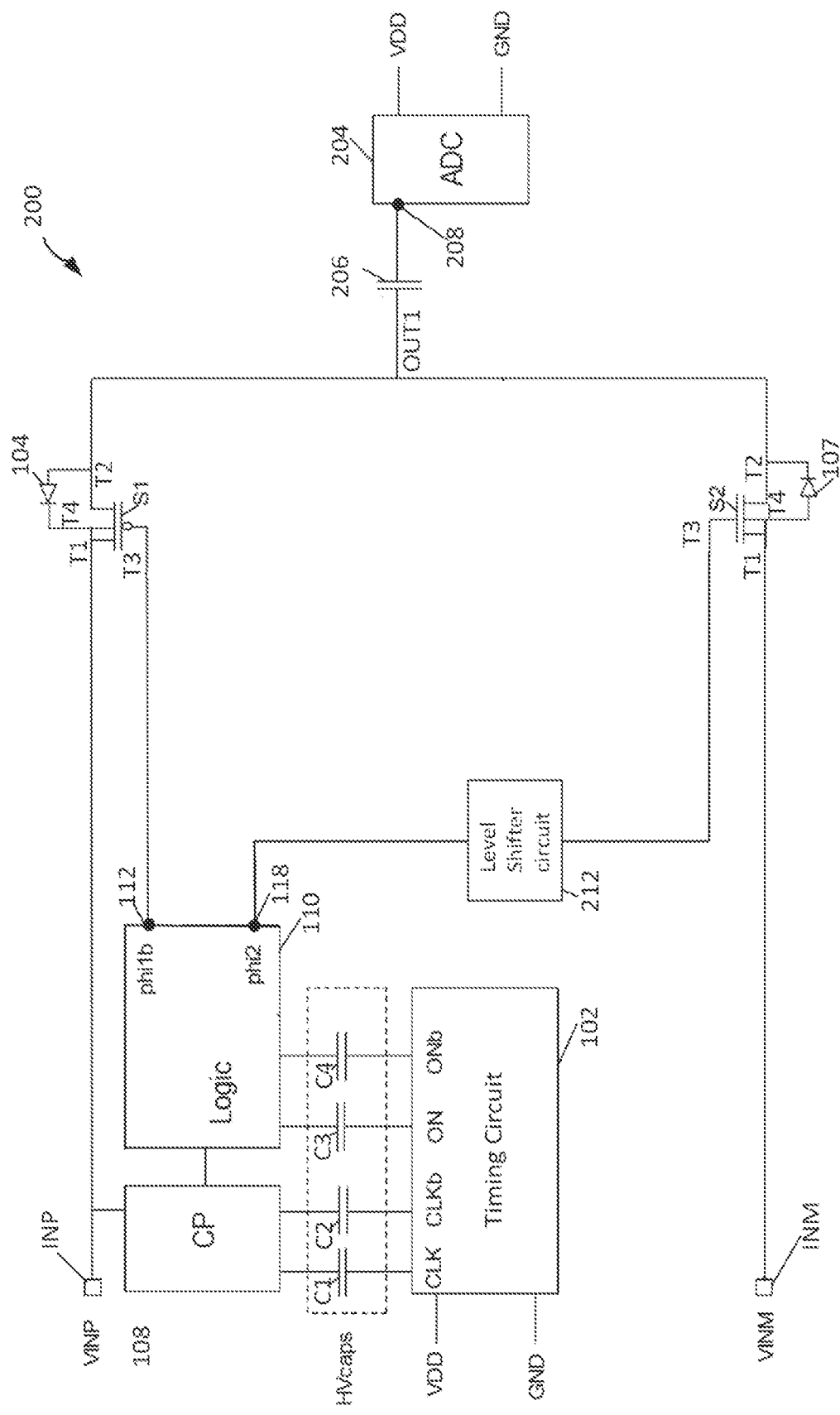
FIG. 2 is a block diagram of an example of a single-ended implementation of an ADC input stage using the bootstrapped switch circuit techniques of this disclosure.

FIG. 2 is a block diagram of a circuit comprising another example of a bootstrapped switch circuit 200 that can implement various techniques of this disclosure coupled to a timing circuit 102 and an ADC 204. Some of the components in FIG. 2 are similar to components in FIG. 1 and use similar reference numbers. For purposes of conciseness, similar components will not be described in detail again.

The bootstrapped switch circuit 200 is an example of a single-ended implementation of an ADC input stage using the bootstrapped switch circuit techniques of this disclosure. The bootstrapped switch circuit 200 has two input terminals INP, INM and an output terminal OUT1 and is coupled to a timing circuit 102 that provides one or more signals, such as the signals CLK and CLKb, and ON and ONb.

The bootstrapped switch circuit 200 receives a first input voltage VINP at the first input terminal INP, and a second input voltage VINM at the second input terminal INM.

The bootstrapped switch circuit 200 includes an alternative second switch S2 to the second switch S1a of FIG. 1, e.g., an N-type field-effect transistor (FET), having a first terminal T1, e.g., a source terminal, coupled to a second input terminal INM, a second terminal T2, e.g., a drain terminal, coupled to the first output terminal OUT1, and a control terminal T3, e.g., a gate terminal. The second switch S2 includes a body diode 107 coupled between a fourth terminal T4, e.g., the body, of the switch S2 and the second terminal T2 of the switch S2. The second terminal T2 of the first switch S1 is coupled to the second terminal T2 of the second switch S2.

At a first output terminal 112 the logic circuit 110 generates a first control signal phi1b based on the charge pump voltage Vcp. At a second output terminal 118 the logic circuit generates a second control signal phi2 based on the charge pump voltage Vcp. At a first output terminal 112 the logic circuit 110 is configured to provide the first control signal phi1b to the control terminal T3 of the first switch S1. At a second output terminal 118 the logic circuit 110 is configured to provide the second control signal phi2 to the control terminal T3 of the second switch S2 via a level shifter circuit 212. The level shifter circuit 212 is configured to receive the second control signal phi2 and generate a second level shifted control signal which is applied to the control terminal T3 of the second switch S2. The level shifter circuit 212 ensures that the control signal applied to the control terminal T3 of the second switch S2 is within the operating voltage of the second switch S2. This enables both switches S1, S2 to be low gate voltage devices (e.g., with an operating voltage of 5V i.e., maximum Vgs=5V) even if they are referenced to VINP (e.g., 50V) and VINM (e.g., 5V).

In the single-ended implementation shown in FIG. 2, the bootstrapped switch circuit 200 operates to alternate the switch-on of S1 and S2 to connect the input to an ADC circuit 204, such as using an input capacitor 206 coupled to the output terminal OUT1 of the bootstrapped switch circuit 200 and an input terminal 208 of the ADC circuit 204. The output terminal OUT1 represents the output terminals of each of the S1 and S2 switches electrically coupled together. The output OUT1 of the bootstrapped switch circuit 200 enables a connection between the input capacitor 206 first to the first input voltage VINP by closing the switch S1. In the example shown, the logic circuit 110 provides control signals phi1b, phi2 to connect the input capacitor 206 first to the first input voltage VINP by closing the switch S1. Then, the logic circuit 110 opens the switch S1 and then closes the switch S2 to connect the input capacitor 206 to the second input voltage VINM. This process repeats.

FIG. 3 is a block diagram of an example of a fully differential implementation of an ADC input stage using the bootstrapped switch circuit techniques of this disclosure. FIG. 3 shows a circuit comprising a bootstrapped switch circuit 300 coupled to a timing circuit 102 and an ADC 204. Some of the components in FIG. 3 are similar to components in FIG. 1 and/or FIG. 2 and use similar reference numbers. For purposes of conciseness, similar components will not be described in detail again.

The bootstrapped switch circuit 300 has two input terminals INP, INM and two output terminals OUT1, OUT2 and is coupled to a timing circuit 102.

The bootstrapped switch circuit 300 includes a first switch S1, e.g., a P-type field-effect transistor (FET), corresponding to the first switch S1 disclosed at FIG. 1. The bootstrapped switch circuit 300 includes a second switch S1a, e.g., a P-type field-effect transistor (FET), corresponding to the second switch S1a disclosed at FIG. 1. The bootstrapped switch circuit 300 includes a third switch S2a, e.g., an N-type field-effect transistor (FET), having a first terminal T1, e.g., a source terminal, coupled to the input terminal INM, a second terminal T2, e.g., a drain terminal, coupled to the second output terminal OUT2, and a control terminal T3, e.g., a gate terminal. The third switch S2a includes a body diode 106 coupled between a fourth terminal T4, e.g., the body of the third switch S2a and the second terminal T2 of the third switch S2a. The bootstrapped switch circuit 300 includes a fourth switch S2, e.g., an N-type field-effect transistor (FET), corresponding to the second switch S2 disclosed at FIG. 2.

The first terminal T1 of the first switch S1 is coupled to the first terminal T1 of the second switch S1a. The first terminal T1 of the third switch S2a is coupled to the first terminal T1 of the fourth switch S2. The second terminal T2 of the first switch S1 is coupled to the second terminal T2 of the fourth switch S2. The second terminal T2 of the second switch S1a is coupled to the second terminal T2 of the third switch S2a.

At a first output terminal 112 the logic circuit 110 generates a first control signal phi1b based on the charge pump voltage Vcp. At a second output terminal 114 the logic circuit generates a second control signal phi2b based on the charge pump voltage Vcp. At a third output terminal 116 the logic circuit 110 generates a third control signal phi1 based on the charge pump voltage Vcp. At a fourth output terminal 118 the logic circuit generates a fourth control signal phi2 based on the charge pump voltage Vcp.

The first control signal phi1b is provided to the control terminal T3 of the first switch S1. The second control signal phi2b is provided to the control terminal T3 of the second switch S1a. The third control signal phi1 is provided to the control terminal T3 of the third switch S2a via a first level shifter circuit 213. The fourth control signal phi2 is provided to the control terminal T3 of the fourth switch S2 via a second level shifter circuit 212. In some examples, the control signals phi1 and phi2 are independent of each other. In some examples, the control signals phi1b and phi2b are independent of each other. In some examples, the control signal phi1b and the control signal phi2b are supplied concurrently. In some examples, the control signal phi1 and the control signal phi2 are supplied concurrently. In some examples, the control signal phi1b has a different timing to the control signal phi1 (e.g., phi1b may be an inverse signal of phi1). In some examples, the control signal phi2b has a different timing to the control signal phi2 (e.g., phi2b may be an inverse signal of phi2). In some examples, the control signals phi1 and phi2 are non-overlapping and have different timings.

The first level shifter circuit 213 is configured to receive the third control signal phi1 and generate a first level shifted control signal which is applied to the control terminal T3 of the third switch S2a. The second level shifter circuit 212 is configured to receive the fourth control signal phi2 and generate a second level shifted control signal which is applied to the control terminal T3 of the fourth switch S2.

In the fully differential implementation shown in FIG. 3, the bootstrapped switch circuit 300 operates to alternate the switch-on of S1 and S2 to connect the input voltages VIMP, VINM to an ADC circuit 204. The bootstrapped switch circuit 300 further operates to alternate the switch-on of S1a and S2a to connect the input voltages VIMP, VINM to the ADC circuit 204.

The bootstrapped switch circuit 300 may have four output terminals, one for each second terminal T2 of a respective switch. The bootstrapped switch circuit 300 may also have two output terminals. The first output terminal OUT1 in FIG. 3 represents the second terminal T2 of the first switch S1 and the second terminal T2 of the fourth switch S2 tied together. The second output terminal OUT2 in FIG. 3 represents the second terminal T2 of the second switch S1a and the second terminal T2 of the third switch S2a tied together.

The first output OUT1 of the bootstrapped switch circuit 300 enables a connection between a first input capacitor 206 first to the first input voltage VINP by closing the switch S1 and then to the second input voltage VINM by closing the switch S2. In the example shown, the logic circuit 110 provides control signals phi1b, phi2 to connect the first input capacitor 206 first to the first input voltage VINP by closing the switch S1. Then, the logic circuit 110 opens the switch S1 and then closes the switch S2 to connect the first input capacitor 206 to the second input voltage VINM. This process repeats.

In addition, the bootstrapped switch circuit 300 operates to alternate the switch-on of S1a and S2a to connect the input to an ADC circuit 204, such as using a second input capacitor 306 coupled to the second output terminal OUT2 of the bootstrapped switch circuit 300 and an input terminal 308 of the ADC circuit 204. The second output terminal OUT2 represents the output terminals of each of the S1a and S2a switches electrically coupled together. The second output OUT2 of the bootstrapped switch circuit 300 enables a connection between the second input capacitor 306 first to the first input voltage VINP by closing the switch S1a and then to the second input voltage VINM by closing the switch S2a. In the example shown, the logic circuit 110 provides control signals phi2b, phi1 to connect the second input capacitor 306 first to the first input voltage VINP by closing the switch S1a. Then, the logic circuit 110 opens the switch S1a and then closes the switch S2a to connect the second input capacitor 306 to the second input voltage VINM. This process repeats.

The circuit 300 can therefore sample the differential input voltage between VINP and VINM onto capacitors 206 and 306, which are coupled to the outputs OUT1 and OUT2 and corresponding inputs of an ADC circuit 204.

In some examples, the switches S1, S1a, S2, and S2a are N-type FETs. In some examples, the switches S1, S1a, S2, and S2a are P-type FETs.

Figure 4:
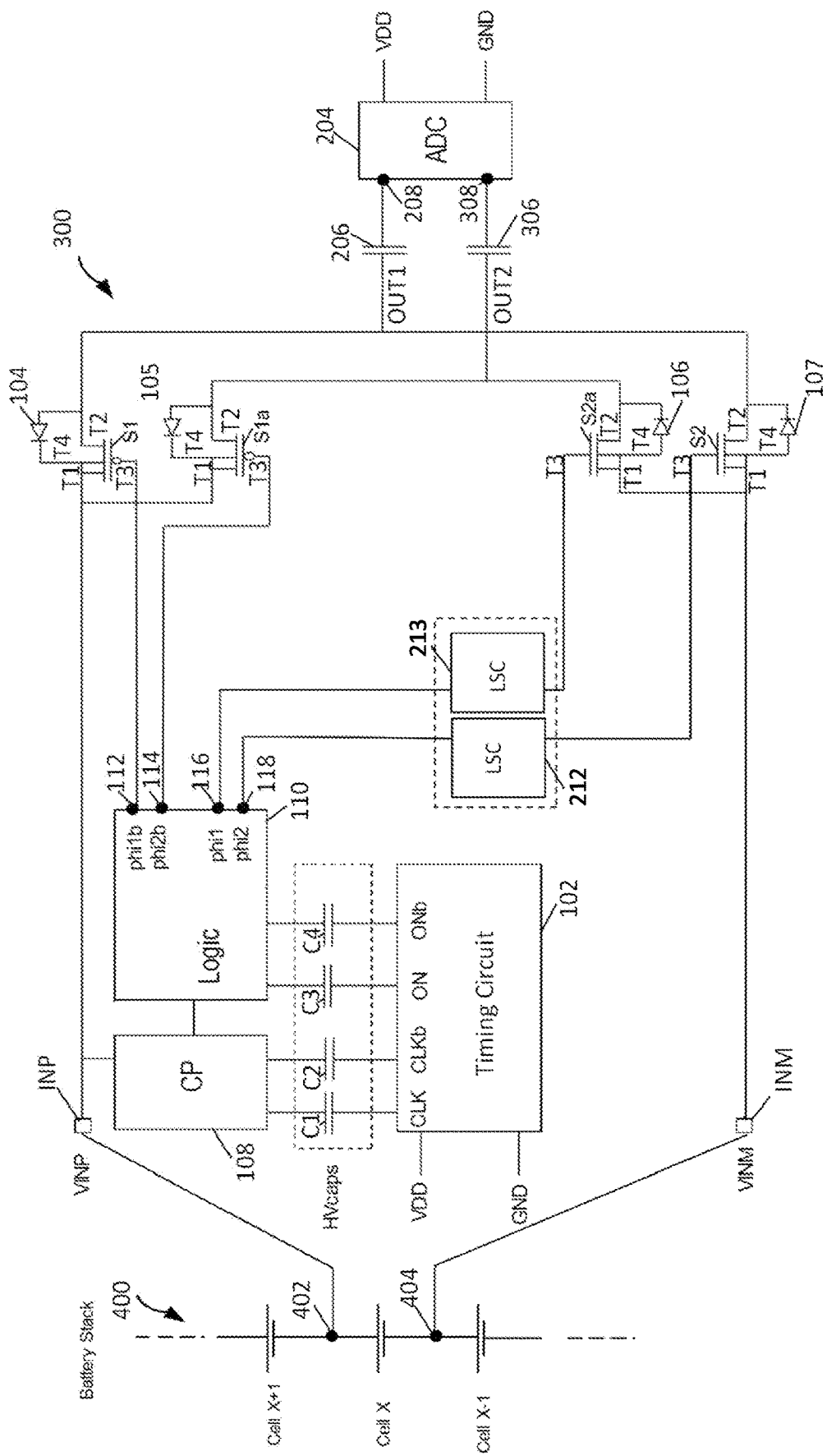
FIG. 4 is a block diagram of an example of a battery management circuit using the bootstrapped switch circuit techniques of this disclosure.

FIG. 4 is a block diagram of an example of a fully differential implementation of an ADC input stage using the bootstrapped switch circuit techniques of this disclosure.

FIG. 4 shows an example of a battery management circuit comprising the circuit of FIG. 3 coupled to a battery stack 400. Some of the components in FIG. 4 are similar to components in FIG. 3 and use similar reference numbers. For purposes of conciseness, similar components will not be described in detail again. Alternatively, other battery management circuits may be implemented using other bootstrapped switch circuit techniques of this disclosure.

The first input terminal INP of the bootstrapped switch circuit 300 is arranged to be coupled to a battery cell (Cell X) anode 402, and the second input terminal INM of the bootstrapped switch circuit 300 is arranged to be coupled to a battery cell (Cell X) cathode 404.

Figure 5:
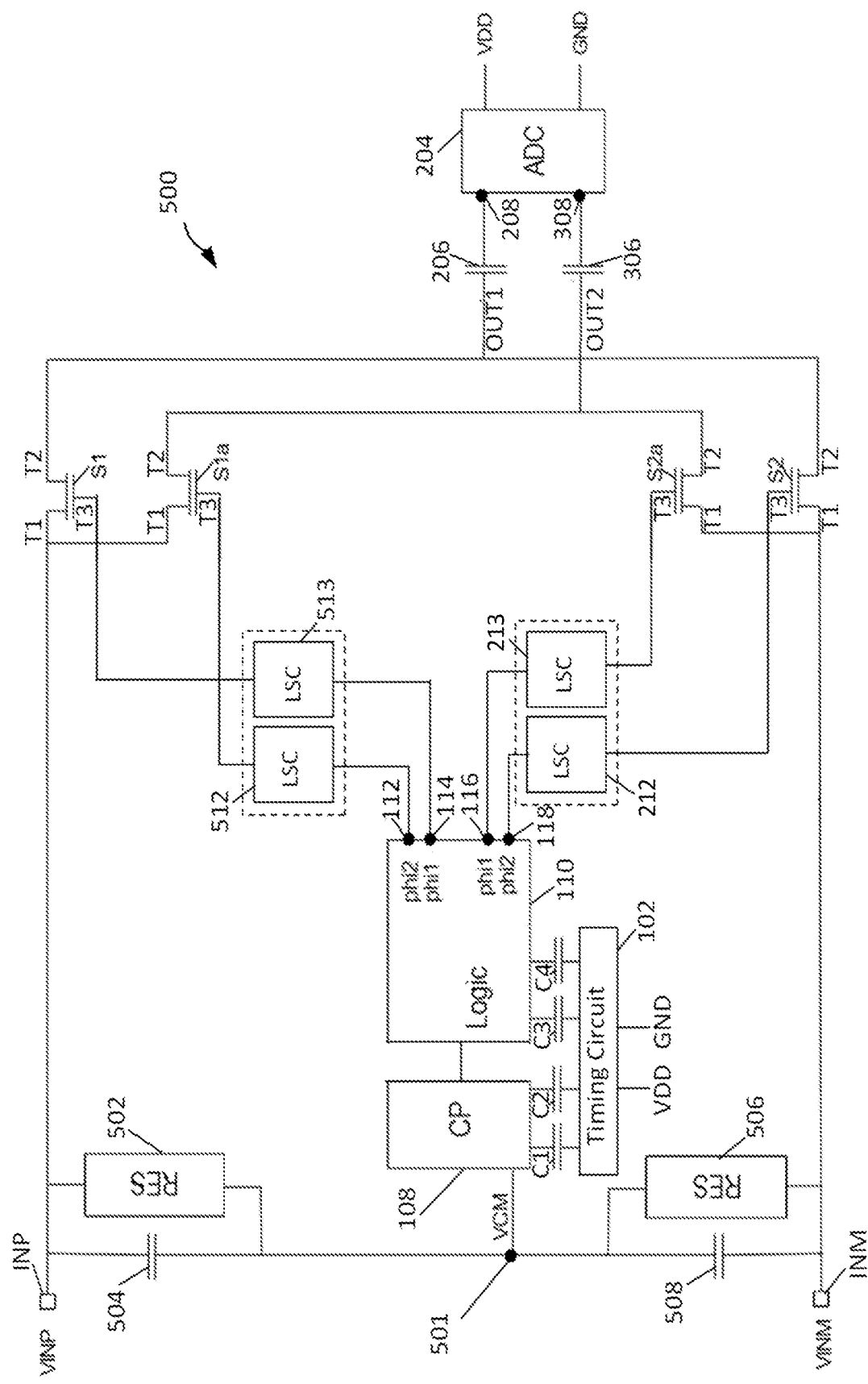
FIG. 5 is a block diagram of another example of a fully differential implementation of an ADC input stage using the bootstrapped switch circuit techniques of this disclosure.

FIG. 5 is a block diagram of an example of a fully differential implementation of an ADC input stage using the bootstrapped switch circuit techniques of this disclosure. Some of the components in FIG. 5 are similar to components in FIG. 3 and use similar reference numbers. For purposes of conciseness, similar components will not be described in detail again. The ADC 204 may be configured as a current sense ADC.

The bootstrapped switch circuit 500 includes a first switch S1, e.g., a N-type field-effect transistor (FET), corresponding to the first switch S1 disclosed at FIG. 4. The bootstrapped switch circuit 500 includes a second switch S1a, e.g., a N-type field-effect transistor (FET), corresponding to the second switch S1a disclosed at FIG. 4. The bootstrapped switch circuit 500 includes a third switch S2a, e.g., an N-type field-effect transistor (FET), corresponding to the third switch S2a disclosed at FIG. 4. The bootstrapped switch circuit 500 includes a fourth switch S2, e.g., an N-type field-effect transistor (FET), corresponding to the second switch S2 disclosed at FIG. 4.

The bootstrapped switch circuit 500 is isolated from the power supply of the timing circuit and receives a common mode voltage VCM input. A first input terminal INP is at a greater voltage potential than the second input terminal INM. A common mode voltage VCM is generated at a common mode node 501 using the first input voltage VINP and the second input voltage VINM.

The common mode node 501 is established between the first input terminal INP and the second input terminal INM. The common mode node 501 may be established with a first resistor 502 in parallel with a first capacitor 504 coupled between the first input terminal INP of the bootstrapped switch circuit 500 and the common mode node 501. The common mode node 501 may be further established with a second resistor 506 in parallel with a second capacitor 508 coupled between the second input terminal INM of the bootstrapped switch circuit 500 and the common mode node 501. The input of the charge pump 108 is coupled to the common mode node 501 and configured to receive a common mode voltage VCM. Alternative circuits and methods for establishing the common mode voltage VCM at the common mode node 501 may be used in place of the resistor and capacitor circuit described above.

Figure 8B:
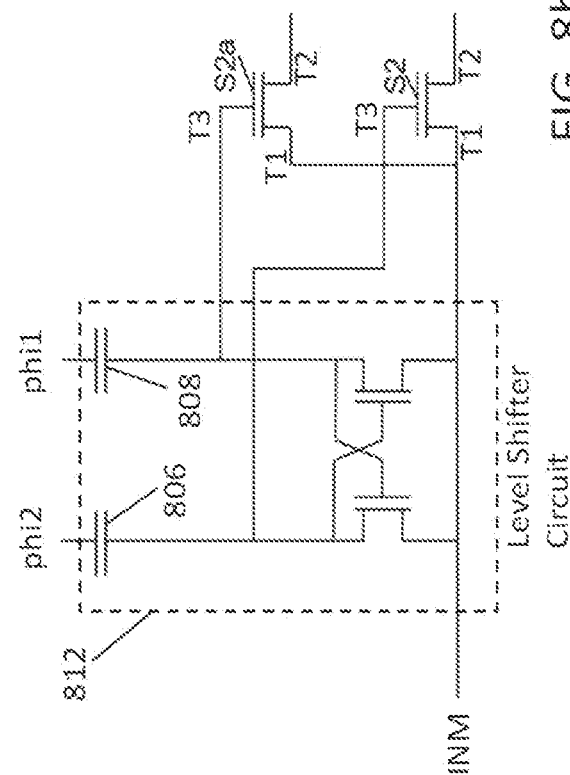
FIG. 8b is another example of a level shifter circuit coupled to two switches suitable for use in any bootstrapped switch circuit of this disclosure.
Figure 8A:
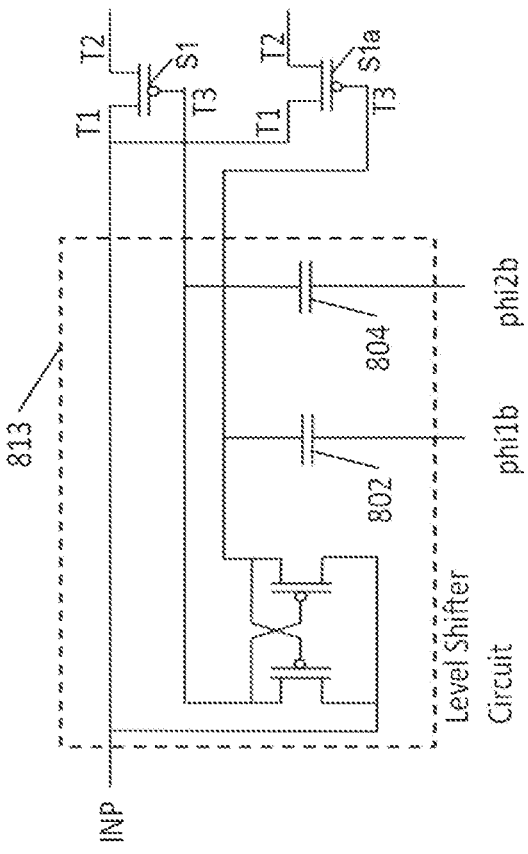
FIG. 8a is an example of a level shifter circuit coupled to two switches suitable for use in any bootstrapped switch circuit of this disclosure.

Since the charge pump 108 receives a common mode voltage VCM, each of the control signals phi1, and phi2 are all binary signals at either the common mode voltage VCM level or the charge pump voltage Vcp level. Although there are four control signals provided at the outputs 112, 114, 116, 118 of the logic circuit 110, only two different control signals phi1, phi2 need to be generated because all switches S1, S1a, S2a, S2 are N-type FET switches. Each of the control signals phi1, and phi2 are level shifted by level shifter circuits 512, 513, 212, and 213 respectively. The level shifter circuits 512, 513, 212, and 213 generate level shifted control signals which are applied to a control terminal T3 of a respective switch S1, S1a, S2a, and S2. In an alternative example, the level shifter circuits 512 and 513 may be a single level shifter circuit (as shown at FIG. 8a), and/or the level shifter circuits 212 and 213 may be a single level shifter circuit (as shown at FIG. 8b).

In the fully differential implementation shown in FIG. 5, the circuit 500 operates in a similar way as the circuit of FIG. 3. However, the bootstrapped switch circuit 500 of FIG. 5 is shown having four N-type FET switches S1, S1a, S2a, and S2. As a result, the control signal phi2 is coupled to the second switch S1a (via the level shifter circuit 512), and the control signal phi1 is coupled to the first switch S1 (via the level shifter circuit 513). The end result of the fully differential implementation is however the same between FIG. 5 and FIG. 6. Specifically, the logic circuit 110 provides control signals phi1, phi2 to connect the first input capacitor 206 first to the first input voltage VINP by closing the switch S1. Then, the logic circuit 110 opens the switch S1 and then closes the switch S2 to connect the first input capacitor 206 to the second input voltage VINM. This process repeats. Then, the logic circuit 110 opens the switch S1 and then closes the switch S2 to connect the first input capacitor 206 to the second input voltage VINM. This process repeats.

The control signals phi1 and phi2 may be independent of each other. The control signals phi1 and phi2 may be non-overlapping.

Each level shifter circuit 512, 513, 212, 213 may be replaced by a gain stage. Each gain stage may be a 2X gain stage.

Figure 6:
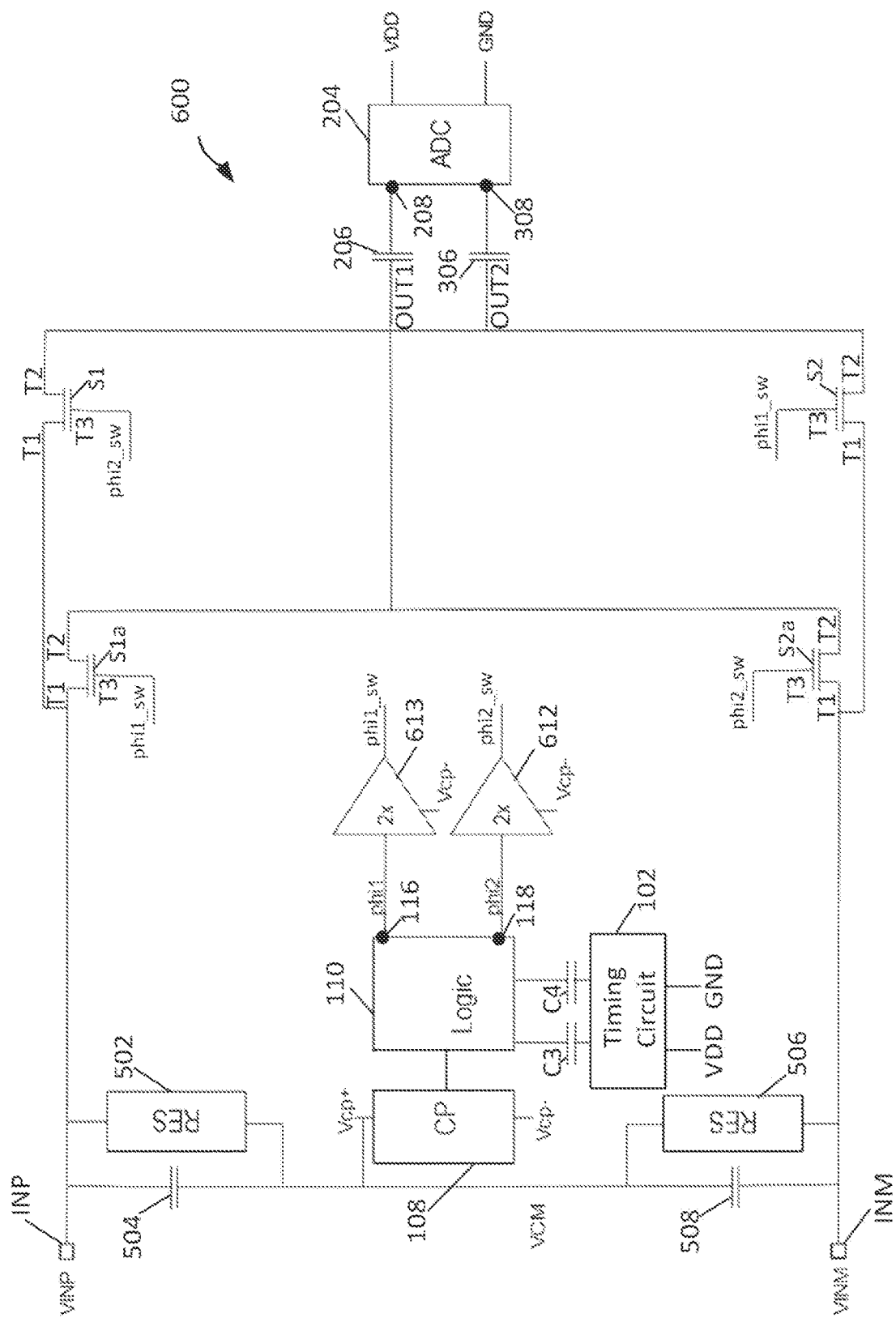
FIG. 6 is a block diagram of another example of a fully differential implementation of an ADC input stage using the bootstrapped switch circuit techniques of this disclosure.

FIG. 6 is a block diagram of an example of a fully differential implementation of an ADC input stage using the bootstrapped switch circuit techniques of this disclosure. Some of the components in FIG. 6 are similar to components in FIG. 5 and use similar reference numbers. For purposes of conciseness, similar components will not be described in detail again. The ADC 204 may be configured as a current sense ADC.

FIG. 6 shows that the four level shifter circuits 512, 513, 212, and 213 of FIG. 5 may be replaced by two gain stages: a first gain stage 613 and a second gain stage 612. The bootstrapped switch circuit 600 comprises a first switch S1, a second switch S1a, a third switch S2a, and a fourth switch S2, which correspond to the first switch S1, the second switch S1a, the third switch S2a, and the fourth switch S2 of FIG. 5. In the example shown, the switches S1, S1a, S2a, S2 are N-type FETs. The bootstrapped switch circuit 600 is particularly well suited to current sense applications.

The first gain stage 613 receives a first control signal phi1 and generates an amplified first control signal phi1_sw. The amplified first control signal phi1_sw is applied to the second switch S1a, and the fourth switch S2. The second gain stage 612 receives a second control signal phi2 and generates an amplified second control signal phi2_sw. The amplified second control signal phi2_sw is applied to the first switch S1, and the third switch S2a.

The first output OUT1 of the bootstrapped switch circuit 600 enables a connection between the first input capacitor 206 first to the first input voltage VINP by closing the switch S1a and then to the second input voltage VINM by closing the switch S2a. In the example shown, the logic circuit 110 provides the control signals phi1, phi2 to connect the first input capacitor 206 first to the first input voltage VINP by closing the switch S1a. Then, the logic circuit 110 opens the switch S1a and then closes the switch S2a to connect the first input capacitor 206 to the second input voltage VINM. This process repeats.

In addition, the bootstrapped switch circuit 600 operates to alternate the switch-on of S1 and S2 to connect the input to the ADC circuit 204, such as using a second input capacitor 306 coupled to the second output terminal OUT2 of the bootstrapped switch circuit 600 and an input terminal 308 of the ADC circuit 204. The second output terminal OUT2 represents the output terminals of each of the S1 and S2 switches electrically coupled together. The second output OUT2 of the bootstrapped switch circuit 600 enables a connection between the second input capacitor 306 first to the first input voltage VINP by closing the switch S1 and then to the second input voltage VINM by closing the switch S2. In the example shown, the logic circuit 110 provides the control signals phi1, phi2 to connect the second input capacitor 306 first to the first input voltage VINP by closing the switch S1. Then, the logic circuit 110 opens the switch S1 and then closes the switch S2 to connect the second input capacitor 306 to the second input voltage VINM. This process repeats.

An advantage of using gain stages (e.g., 613, 612 of FIG. 6) is that the switches (e.g., S1a, S1, S2a, S2) can be driven with control signals ranging from VCM−Vcp to VCM+Vcp, enabling to sample negative differential input signals where VINP<VINM. An NMOS transistor needs a gate to source voltage greater the threshold voltage for turning-on. For turning-off Vgs has to be lower than one threshold voltage.

The two gain stages 613 and 612 are each referenced to a reference voltage Vcp−. The reference voltage Vcp− is below the common mode voltage VCM (Vcp+). The reference voltage Vcp− may be generated by the charge pump 108. The control signals phi1_sw and phi2_sw generated by the first gain stage 613 and the second gain stage 612 respectively. Each of the two control signals phi1_sw and phi2_sw are binary signals at either the common mode voltage VCM level+Vcp or the reference voltage Vcp− level. This may result in a more reliable switch turn on.

To provide an example, the input voltage VINP may be 52V, the input voltage INM may be 48V. Therefore, the VCM may be 50V, and the charge pump 108 may generate Vcp− as 45V. Therefore, phi1 may have a range of 45V to 50V, and phi1_sw may have a range of 45V to 55V. Therefore, phi2 may have a range of 45V to 50V, and phi2_sw may have a range of 45V to 55V.

FIG. 7 is an example of a timing diagram of various signals generated by a timing circuit and the logic circuit. Signals CLK and CLKb are shown at 700 and 702, respectively. Signals CLK and CLKb drive the charge pump, e.g., the charge pump 108 of FIG. 2. Signal ON is shown at 704. Signal ONb is not shown, however, ONb is an inverse signal to ON. Signals ON and ONb are applied to the logic circuit, e.g., the logic circuit 110 of FIG. 2, which drives the switches. A charge pump can be stronger the faster it is clocked. As such, the signals CLK and CLKb are clocked at a faster rate than the signals ON and ONb. In other words, the signals CLK and CLKb may have shorter pulse widths than those of the signals ON and ONb. Once the signals ON and ONb pass the capacitors C3, C4 respectively, the signals ON and ONb are level shifted to the voltage domain determined via the charge pump circuit to generate ON_ls (shown at 706), and ONb_ls (not shown). The control signals phi1 and phi2 are shown at 708 and 710 respectively. The control signals phi1 and phi2 are generated by the logic circuit, e.g., logic circuit 110 of FIG. 2 or FIG. 6. Optionally, and in the example shown, the control signals phi1 and phi2 are non-overlapping. Non-overlapping control signals phi1 and phi2 ensure that switches which have their outputs coupled together (e.g, switches S1 and S2 of FIG. 6) do not turn on at the same time.

FIG. 8a shows that the level shifter circuits 512, 513 of FIG. 5 may be implemented as a latch-based level shifter circuit 813, which may be applied to any example herein. FIG. 8b shows that the level shifter circuits 212, 213 of at least FIG. 5 may be implemented as a latch-based level shifter circuit 812, which may be applied to any example herein. The level shifter circuit 813 comprises low voltage capacitors 802, 804 to separate the voltage domain of the charge pump from the voltage domain of the first input voltage VINP. The level shifter circuit 812 comprises low voltage capacitors 806, 808 to separate the voltage domain of the charge pump from the voltage domain of the second input voltage VINM. The switches S1, S1a of FIG. 8a are shown to be N-type switches, however, replacing the switches S1, S1a with P-type switches would make the circuit be operable with phi1 and phi2 as inputs. The switches S2, S2a of FIG. 8b are shown to be N-type switches, however, replacing the switches S2, S2a with P-type switches would make the circuit be operable with phi1b and phi2b as inputs.

Figure 9:
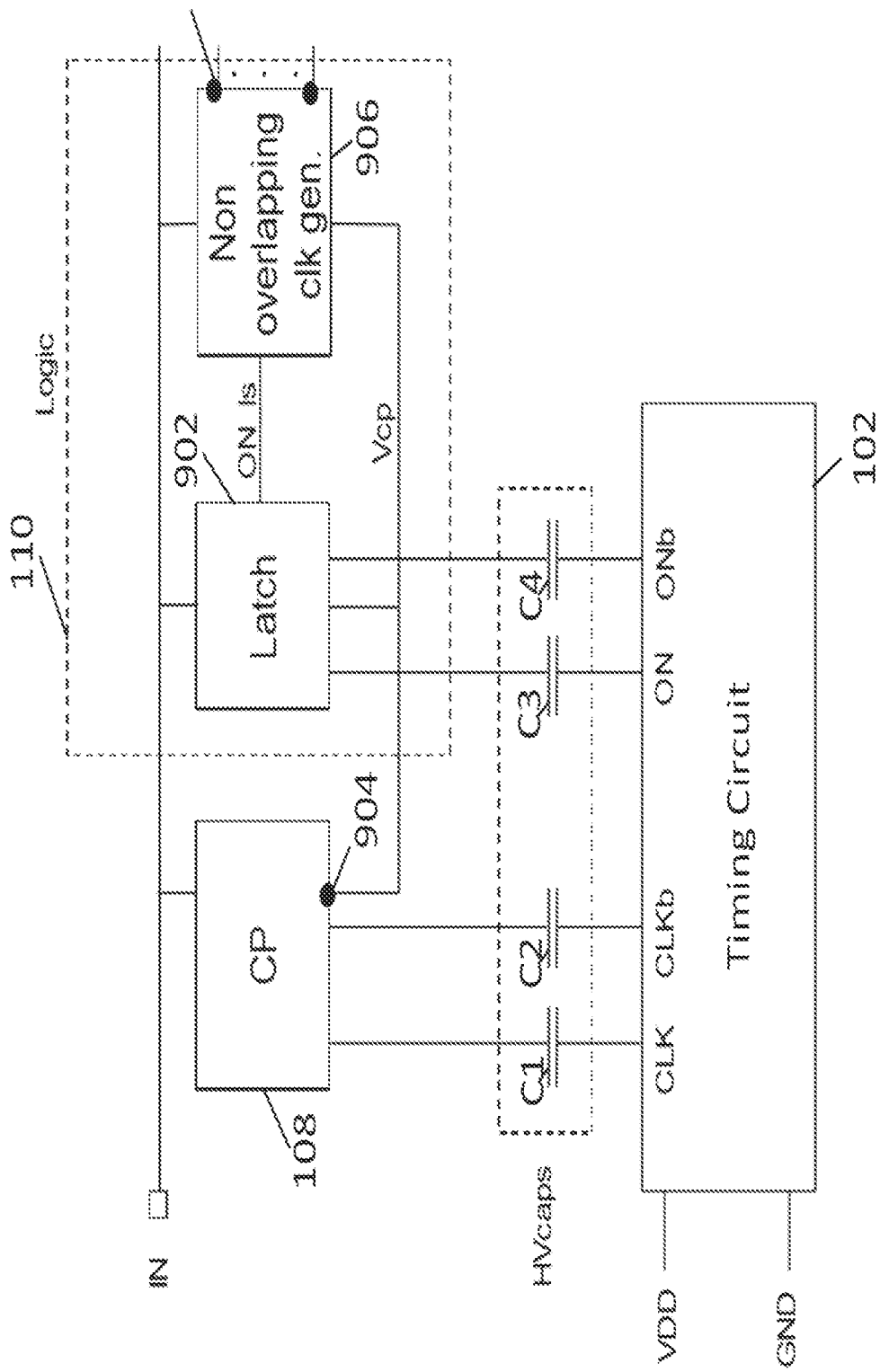
FIG. 9 is an example of a logic circuit suitable for use in any bootstrapped switch circuit of this disclosure.

FIG. 9 shows an example of a logic circuit 110, such as logic circuit 110 of FIG. 1, which may be applied to any example herein. The logic circuit 110 may comprise a latch circuit 902 coupled to an input terminal IN (e.g., VINP of FIG. 1) and the output 904 of the charge pump 108. It can be seen that all of the output control signals of the logic circuit 110 (and non-overlapping clock generator circuit 906) are derived from a signal ON_Is level shifted to the charge pump voltage domain.

The logic circuit 110 may further comprise a non-overlapping clock generator circuit 906 coupled to an input terminal IN (e.g., VINP of FIG. 1) and the output terminal 904 of the charge pump 108. The output of the latch 902 is coupled to the non-overlapping clock generator circuit 906. An output logic signal ON_Is of the latch 902 may be a level shifted signal based on the signals ON and ONb from the timing circuit 102. The non-overlapping clock generator circuit 906 may receive the output logic signal ON_Is of the latch 902 and generate two or more control signals (e.g., phi1$b$, phi2$b$, phi1, phi2 of FIG. 3). Thus, allowing several unrelated switches to be controlled through one charge pump 108 and logic circuit 110. The non-overlapping clock generation circuit 906 may generate the first control signal (e.g., phi1$b$) at the first output terminal 112 of the logic circuit 110 and the second control signal (e.g., phi2$b$) at the second output terminal (e.g, 114) of the logic circuit 110.

The input terminal IN may provide a high voltage level to the charge pump 108, the latch 902, and the non-overlapping clock generation circuit 906. The output terminal 904 of the charge pump 108 may provide a low voltage level to the latch 902 and the non-overlapping clock generation circuit 906. The control signals (e.g., phi1$b$, phi2$b$, phi1, phi2) output from the non-overlapping clock generation circuit 906 may be a binary signal, as shown at FIG. 7.

The non-overlapping clock generation circuit 906 may create break-before-make signal(s) (e.g., phi1$b$, phi2$b$, phi1, phi2 of FIG. 3) to control the switches (e.g., S1, S1$a$, S2$a$, S2 of FIG. 3). This may ensure perfect timing and an area efficient implementation at the same time.

In embodiments disclosed above, the bootstrapped switches may be capacitively coupled to an ADC. Alternatively, the bootstrapped switches may be resistively coupled to an ADC.

In embodiments disclosed above the bootstrapped switch circuits may be fully capacitor isolated.

The logic circuit 110 of any example may be coupled to one or more signal adjustment circuits. The one or more signal adjustment circuits may each receive control signal from the output of a logic circuit 110 (e.g., output 112, 114, 116, 118) and generate an adjusted control signal which is applied to a control terminal of a switch (e.g., S1, S1$a$, S2, S2$a$), wherein the signal adjustment circuit is a level shifter circuit or a gain stage. The gain stage may be a 2X gain stage. In some examples, the gain stage includes an amplifier circuit. The logic circuit may be a CMOS logic circuit.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the present application may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the present application should be determined with reference to the appended claims, along with the full scope of equivalents to which such claims are entitled.

The invention claimed is:

1. A bootstrapped switch circuit coupled to a timing circuit that provides one or more signals, the bootstrapped switch circuit having one or more input terminals and one or more output terminals, the bootstrapped switch circuit being electrically isolated from a power supply of the timing circuit, the bootstrapped switch circuit comprising:
   a charge pump including an input coupled to the one or more input terminals of the bootstrapped switch circuit and the timing circuit, wherein the charge pump generates a charge pump voltage at an output of the charge pump;
   a logic circuit coupled to the timing circuit, the logic circuit including a voltage input coupled to the output of the charge pump, wherein the logic circuit generates: a first control signal based on the voltage input at a first output terminal; and a second control signal based on the voltage input at a second output terminal;
   a first switch having a first terminal coupled to the one or more input terminals of the bootstrapped switch circuit, a second terminal directly coupled to the one or more output terminals, and a control terminal coupled to the first output terminal of the logic circuit; and
   a second switch having a first terminal coupled to the one or more input terminals of the bootstrapped switch circuit, a second terminal directly coupled to the one or more output terminals, and a control terminal coupled to the second output terminal of the logic circuit.

2. The bootstrapped switch circuit of claim 1, wherein the logic circuit comprises a latch circuit and a non-overlapping clock generation circuit, wherein the latch circuit is coupled to the timing circuit and generates a logic signal, wherein the non-overlapping clock generation circuit generates the first control signal and the second control signal based on the logic signal.

3. The bootstrapped switch circuit of claim 2, wherein the non-overlapping clock generation circuit comprises:
   a first input terminal coupled to the one or more input terminals of the bootstrapped switch circuit;
   a second input terminal configured to receive the logic signal; and
   a third input terminal coupled to the output of the charge pump and configured to receive the charge pump voltage, wherein the non-overlapping clock generation circuit generates the first control signal at the first output terminal of the logic circuit and the second control signal at the second output terminal of the logic circuit.

4. The bootstrapped switch circuit of claim 1, wherein the first control signal has a different timing to the second control signal.

5. The bootstrapped switch circuit of claim 1, wherein the one or more output terminals comprise:
   a first output terminal coupled to the second terminal of the first switch; and
   a second output terminal coupled to the second terminal of the second switch, wherein the first terminal of the first switch is coupled to the first terminal of the second switch.

6. The bootstrapped switch circuit of claim 1 further comprising: a signal adjustment circuit, wherein the signal adjustment circuit is a level shifter circuit or a gain stage, wherein the one or more input terminals of the bootstrapped switch circuit comprise:
   a first input terminal coupled to the charge pump and the first terminal of the first switch; and
   a second input terminal coupled to the first terminal of the second switch, wherein the second output terminal of the logic circuit is coupled to the control terminal of the second switch via the signal adjustment circuit.

7. The bootstrapped switch circuit of claim 6, where the first input terminal is a positive input terminal directly coupled to the charge pump, and the second input terminal is a negative input terminal.

8. The bootstrapped switch circuit of claim 6, wherein the signal adjustment circuit is a level shifter circuit comprising capacitors.

9. The bootstrapped switch circuit of claim 6, wherein the signal adjustment circuit is a gain stage.

10. The bootstrapped switch circuit of claim 1, further comprising: a first gain stage and a second gain stage, wherein the one or more input terminals of the bootstrapped switch circuit comprise:
    a first input terminal coupled the first terminal of the first switch; and
    a second input terminal coupled to the first terminal of the second switch, wherein the input of the charge pump is configured to receive a common mode voltage generated using a voltage at the first input terminal and a voltage at the second input terminal,
    wherein the first output terminal of the logic circuit is coupled to the control terminal of the first switch via the first gain stage,
    wherein the second output terminal of the logic circuit is coupled to the control terminal of the second switch via the second gain stage.

11. The bootstrapped switch circuit of claim 10, further comprising:
    a first resistor coupled between the first input terminal and the input of the charge pump;
    a first capacitor coupled in parallel with the first resistor;
    a second resistor coupled between the second input terminal and the input of the charge pump; and
    a second capacitor coupled in parallel with the second resistor.

12. The bootstrapped switch circuit of claim 1, wherein the logic circuit further generates:
    a third control signal based on the voltage input at a third output terminal of the logic circuit;
    a fourth control signal based on the voltage input at a fourth output terminal of the logic circuit, wherein the bootstrapped switch circuit further comprises:
    a first signal adjustment circuit, wherein the first signal adjustment circuit is a level shifter circuit or a gain stage;
    a second signal adjustment circuit, wherein the second signal adjustment circuit is a level shifter circuit or a gain stage;
    a third switch having a first terminal coupled to the one or more input terminals of the bootstrapped switch circuit, a second terminal coupled to the one or more output terminals, and a control terminal, wherein the third output terminal of the logic circuit is coupled to the control terminal of the third switch via the first signal adjustment circuit; and
    a fourth switch having a first terminal coupled to the one or more input terminals of the bootstrapped switch circuit, a second terminal coupled to the one or more output terminals, and a control terminal, wherein the fourth output terminal of the logic circuit is coupled to the control terminal of the fourth switch via the second signal adjustment circuit, wherein the one or more input terminals of the bootstrapped switch circuit comprise:
  a first input terminal coupled to the first terminal of the first switch and the first terminal of the second switch; and
  a second input terminal coupled to the first terminal of the third switch and the first terminal of the fourth switch.

13. The bootstrapped switch circuit of claim 12, wherein the second terminal of the first switch is coupled to the second terminal of the fourth switch, and the second terminal of the second switch is coupled to the second terminal of the third switch.

14. The bootstrapped switch circuit of claim 1, wherein the one or more output terminals of the bootstrapped switch circuit comprise an output coupled to the second terminal of the first switch and the second terminal of the second switch and arranged to be coupled to an input of an analog-to-digital converter circuit.

15. A circuit comprising:
  a bootstrapped switch circuit coupled to a timing circuit that provides one or more signals, the bootstrapped switch circuit having one or more input terminals and one or more output terminals, the bootstrapped switch circuit being electrically isolated from a power supply of the timing circuit, the bootstrapped switch circuit including:
  a charge pump comprising an input coupled to the one or more input terminals of the bootstrapped switch circuit and the timing circuit, wherein the charge pump generates a charge pump voltage at an output of the charge pump;
  a logic circuit coupled to the timing circuit, the logic circuit including a voltage input coupled to the output of the charge pump, wherein the logic circuit receives a timing control signal and generates: a first control signal based on the timing control signal at a first output terminal; and a second control signal based on the timing control signal at a second output terminal, wherein the first control signal has a different timing to the second control signal;
  a first switch having a first terminal coupled to the one or more input terminals of the bootstrapped switch circuit, a second terminal directly coupled to the one or more output terminals, and a control terminal coupled to the first output terminal of the logic circuit;
  a second switch having a first terminal coupled to the one or more input terminals of the bootstrapped switch circuit, a second terminal directly coupled to the one or more output terminals, and a control terminal coupled to the second output terminal of the logic circuit;
  a first capacitor comprising: a first terminal coupled to the one or more output terminals of the bootstrapped switch circuit; and a second terminal; and
  an analog-to-digital converter circuit comprising:
    a first input terminal coupled to the second terminal of the first capacitor.

16. The circuit of claim 15, wherein the one or more output terminals of the bootstrapped switch circuit comprise a first output terminal and a second output terminal of the bootstrapped switch circuit, wherein the circuit further comprises:
  a second capacitor comprising: a first terminal coupled to the second output terminal of the bootstrapped switch circuit; and a second terminal; and,
  wherein the first terminal of the first capacitor is coupled to the first output terminal of the bootstrapped switch circuit,
  wherein the analog-to-digital converter circuit further comprises a second input terminal coupled to the second terminal of the second capacitor.

17. The circuit of claim 16, wherein the analog-to-digital converter circuit is configured in a fully differential configuration.

18. The circuit of claim 15, wherein the circuit is a battery management circuit, wherein the logic circuit further generates:
  a third control signal based on the voltage input at a third output terminal of the logic circuit;
  a fourth control signal based on the voltage input at a fourth output terminal of the logic circuit, wherein the bootstrapped switch circuit further comprises:
  a first signal adjustment circuit, wherein the first signal adjustment circuit is a level shifter circuit or a gain stage;
  a second signal adjustment circuit, wherein the second signal adjustment circuit is a level shifter circuit or a gain stage;
  a third switch having a first terminal coupled to the one or more input terminals of the bootstrapped switch circuit, a second terminal coupled to the one or more output terminals, and a control terminal coupled to the third output terminal of the logic circuit via the first signal adjustment circuit; and
  a fourth switch having a first terminal coupled to the one or more input terminals of the bootstrapped switch circuit, a second terminal coupled to the one or more output terminals, and a control terminal coupled to the fourth output terminal of the logic circuit via the second signal adjustment circuit,
  wherein the one or more input terminals of the bootstrapped switch circuit comprise: a first input terminal and a second input terminal,
  wherein the first terminal of the first switch is coupled to the first terminal of the second switch and the first input terminal of the bootstrapped switch circuit, and
  wherein the first terminal of the third switch is coupled to the first terminal of the fourth switch and the second input terminal of the bootstrapped switch circuit,
  wherein the first input terminal of the bootstrapped switch circuit is arranged to be coupled to a battery cell anode, and the second input terminal of the bootstrapped switch circuit is arranged to be coupled to a battery cell cathode.

19. The circuit of claim 18, wherein the second terminal of the first switch is coupled to the second terminal of the fourth switch and the first terminal of the first capacitor,
  a second capacitor comprising: a first terminal coupled to the second output terminal of the bootstrapped switch circuit; and a second terminal; and, wherein the first terminal of the first capacitor is coupled to the first output terminal of the bootstrapped switch circuit,
  the analog-to-digital converter circuit has a second input terminal coupled to the second terminal of the second capacitor,
  and the second terminal of the second switch is coupled to the second terminal of the third switch and the first terminal of the second capacitor.

20. A circuit comprising:
  a bootstrapped switch circuit coupled to a timing circuit that provides one or more signals, the bootstrapped switch circuit being electrically isolated from a power supply of the timing circuit, the bootstrapped switch circuit comprising:

a first input terminal and a second input terminal;
one or more output terminals;
a charge pump coupled to the timing circuit, wherein the charge pump comprises an input configured to receive a common mode voltage generated based on:
   an input voltage at the first input terminal of the bootstrapped switch circuit; and
   a second input voltage at the second input terminal of the bootstrapped switch circuit, wherein the charge pump generates a charge pump voltage at an output of the charge pump;
a logic circuit coupled to the timing circuit, the logic circuit comprising a voltage input coupled to the output of the charge pump, wherein the logic circuit generates: a first control signal; and a second control signal;
a first signal adjustment circuit, wherein the signal adjustment circuit is a level shifter circuit or a gain stage, and configured to receive the first control signal and generate a first adjusted control signal;
a second signal adjustment circuit, wherein the signal adjustment circuit is a level shifter circuit or a gain stage configured to receive the second control signal and generate a second adjusted control signal;
a first switch having a first terminal coupled to the first input terminal of the bootstrapped switch circuit, a second terminal coupled to the one or more output terminals, and a control terminal configured to receive the first adjusted control signal; and
a second switch having a first terminal coupled to the second input terminal of the bootstrapped switch circuit, a second terminal coupled to the one or more output terminals, and a control terminal configured to receive the second adjusted control signal.

* * * * *